United States Patent
Yagihashi

(10) Patent No.: US 9,932,523 B2
(45) Date of Patent: Apr. 3, 2018

(54) GREEN PHOSPHOR AND PRODUCTION METHOD THEREFOR, PHOSPHOR SHEET, AND ILLUMINATION DEVICE

(71) Applicant: Dexerials Corporation, Shinagawa-ku, Tokyo (JP)

(72) Inventor: Kazuhiro Yagihashi, Utsunomiya (JP)

(73) Assignee: Dexerials Corporation, Shinagawa-ku, Tokyo (JP)

( * ) Notice: Subject to any disclaimer, the term of this patent is extended or adjusted under 35 U.S.C. 154(b) by 69 days.

(21) Appl. No.: 14/917,665

(22) PCT Filed: Sep. 16, 2014

(86) PCT No.: PCT/JP2014/004757
§ 371 (c)(1),
(2) Date: Mar. 9, 2016

(87) PCT Pub. No.: WO2015/040855
PCT Pub. Date: Mar. 26, 2015

(65) Prior Publication Data
US 2016/0222287 A1    Aug. 4, 2016

(30) Foreign Application Priority Data
Sep. 20, 2013   (JP) ................. 2013-195518

(51) Int. Cl.
*C09K 11/77* (2006.01)
*F21V 9/16* (2006.01)
*G02F 1/1335* (2006.01)

(52) U.S. Cl.
CPC ............ *C09K 11/7731* (2013.01); *F21V 9/16* (2013.01); *G02F 2001/133614* (2013.01)

(58) Field of Classification Search
None
See application file for complete search history.

(56) References Cited

U.S. PATENT DOCUMENTS

2011/0273864 A1* 11/2011 Izawa ................. C09K 11/7741
362/84

FOREIGN PATENT DOCUMENTS

| CN | 102241977 A | 11/2011 |
| EP | 2386617 A1 | 11/2011 |
| JP | 2011-236310 A | 11/2011 |
| WO | 2011/033830 A1 | 3/2011 |

OTHER PUBLICATIONS

Benalloul et al., Journal of the Electrochemical Society, 2003, 150(1), G62-G65.*
"Estimating Crystallite Size Using XRD" by Scott A. Speakman, Ph.D. from MIT Center for Materials Science and Engineering. The presentation is available online at prism.mit.edu/xray/oldsite/CrystalSizeAnalysis.ppt.*

(Continued)

*Primary Examiner* — Vu A Nguyen
(74) *Attorney, Agent, or Firm* — Kenja IP Law PC

(57) ABSTRACT

Provided is a green phosphor having high conversion efficiency. The green phosphor is represented by the composition formula $(Sr_{1-y}Ca_y)_{1-x}Ga_2S_4:Eu_x$ ($0.03 \leq x \leq 0.20$ and $0 < y \leq 1$). A full width at half maximum of a diffraction peak corresponding to a (422) plane in an XRD pattern is less than 0.18.

7 Claims, 3 Drawing Sheets

(56) References Cited

OTHER PUBLICATIONS

Ko et al. (Bull. Korean Chem. Soc. 2008, 29(4), 822-826).*
Apr. 21, 2017, Office Action issued by the State Intellectual Property Office in the corresponding Chinese Patent Application No. 201480051477.0.
Apr. 24, 2017, the Extended European Search Report issued by the European Patent Office in the corresponding European Patent Application No. 14846210.4.
Sep. 30, 2016, Office Action issued by the State Intellectual Property Office in the corresponding Chinese Patent Application No. 201480051477.0.
Young Rag Do, et al., Luminescence Properties of Potential Sr1-XCaXGa2S4: Eu Green- and Greenish-Yellow-Emitting Phosphors for White LED, Journal of the Electrochemical Society, (2006), vol. 153, No. 7, pp. H142-H146.
Nov. 25, 2014, International Search Report issued in the International Patent Application No. PCT/JP2014/004757.
Journal of Rare Earths, 2007, 25, 701-705.
Journal of the Electrochemical Society, 2001, 148(7), D89-D93.
Journal of MMIJ vol. 126 p. 456-459(2010).

\* cited by examiner

GREEN PHOSPHOR AND PRODUCTION METHOD THEREFOR, PHOSPHOR SHEET, AND ILLUMINATION DEVICE

CROSS-REFERENCE TO RELATED APPLICATION

This application claims priority to and the benefit of Japanese Patent Application No. 2013-195518 (filed on Sep. 20, 2013), the entire contents of which are incorporated herein by reference.

TECHNICAL FIELD

The present disclosure relates to a green phosphor and a method of producing the green phosphor, a phosphor sheet, and an illumination device, and especially to a green phosphor represented by $SrGa_2S_4$:Eu and a method of producing the green phosphor represented by $SrGa_2S_4$:Eu, a phosphor sheet containing the green phosphor, and an illumination device including the phosphor sheet.

BACKGROUND

A $SrGa_2S_4$:Eu (hereinafter, written as SGS) phosphor is attracting attention as a green light emitting phosphor to be excited by a blue LED because the phosphor is excited by light in near-ultraviolet to blue regions. The SGS phosphor has a high color purity and high light emitting efficiency. Furthermore, by substituting Ca for the Sr site in the SGS phosphor, the wavelength of the phosphor may be increased approximately to 560 nm (refer to Patent Literature 1, for example).

Patent Literature 1 describes production of a green light emitting phosphor by preparing a powder containing europium and strontium from a solution containing a europium compound and a strontium compound, mixing the resulting powder and a powdered gallium compound, and performing firing, wherein the green-emitting phosphor is composed of $(Sr,Ba,Ca)_{1-x}Ga_2S_4$:$Eu_x$ (where $0.10 \leq x \leq 0.20$, preferably $0.10 \leq x \leq 0.18$), and the value of (internal quantum efficiency/absorption efficiency) is 0.7 or more.

Patent Literature 2 describes an XRD pattern using a CuKα ray, of a phosphor including a host crystal containing Ca, Ga, and S.

However, the aforementioned conventional phosphors still do not have sufficient conversion efficiency as a green light emitting phosphor to be excited by a blue LED, and a green phosphor having higher conversion efficiency is required.

CITATION LIST

Patent Literatures

PTL1: JP 2011236310A
PTL2: WO 2011033830

Non-Patent Literature

NPL 1: Journal of MMIJ, Vol. 126, pp. 456 to 459 (2010)

SUMMARY

Technical Problem

The present disclosure is to solve the aforementioned problem in conventional technology, and the present disclosure is to provide a green phosphor having high conversion efficiency.

Solution to Problem

The present inventor has conducted earnest studies and found that high conversion efficiency may be achieved and the above objective may be attained when a full width at half maximum of a diffraction peak corresponding to a (422) plane in an XRD pattern is less than a predetermined value, and thus, achieved the present disclosure.

One of aspects of the present disclosure, for solving the aforementioned problem, resides in a green phosphor represented by the composition formula $(Sr_{1-y}Ca_y)_{1-x}Ga_2S_4$:$Eu_x$ ($0.03 \leq x \leq 0.20$ and $0 < y \leq 1$), wherein a full width at half maximum of a diffraction peak corresponding to a (422) plane in an XRD pattern is less than 0.18.

Another aspect of the present disclosure resides in a phosphor sheet, including: moisture vapor barrier films; and a phosphor layer sandwiched between the moisture vapor barrier films, wherein the phosphor layer contains a green phosphor and a red phosphor, the green phosphor being represented by the composition formula $(Sr_{1-y}Ca_y)_{1-x}Ga_2S_4$:$Eu_x$ ($0.03 \leq x \leq 0.20$ and $0 < y \leq 1$) and having a full width at half maximum of a diffraction peak corresponding to a (422) plane in an XRD pattern of less than 0.18.

Yet another aspect of the present disclosure resides in an illumination device, including the above phosphor sheet.

Yet another aspect of the present disclosure resides in a method of producing a green phosphor, including the steps of: dripping a mixed solution containing a europium compound, a strontium compound, and a calcium compound into a sulfite solution to which a powdered gallium compound is added; and firing, after a sulfite powdered mixture containing Sr, Ca, Eu, and Ga is prepared, the prepared powdered mixture to produce a green phosphor represented by the composition formula $(Sr_{1-y}Ca_y)_{1-x}Ga_2S_4$:$Eu_x$ ($0.03 \leq x \leq 0.20$ and $0 < y \leq 1$).

Advantageous Effect

According to the present disclosure, since the full width at half maximum of the diffraction peak corresponding to the (422) plane in the XRD pattern is less than 0.18, high crystallinity, and accordingly, high conversion efficiency are achieved.

BRIEF DESCRIPTION OF THE DRAWING

In the accompanying drawings.

DETAILED DESCRIPTION

Figure 1:
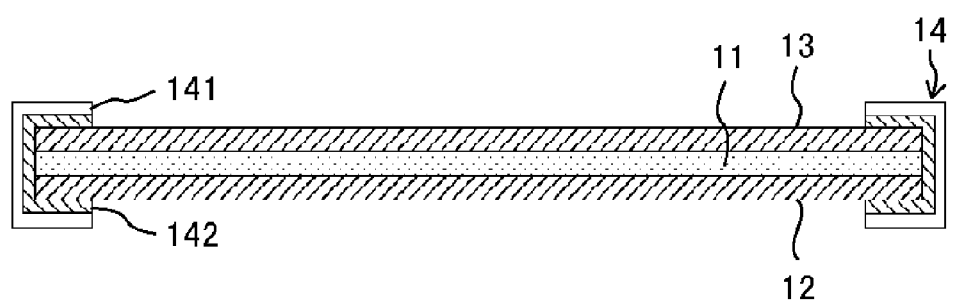
FIG. 1 is a schematic sectional view illustrating a structural example of a phosphor sheet.

Preferred embodiments according to the present disclosure (hereinafter, called the present embodiments) will be described in detail below in the following order with reference to the drawings. Needless to say, the present disclosure is not limited to the following embodiments, and various changes may be made without departing from the gist of the present disclosure. The drawings are merely schematically illustrated and proportions of dimensions and so forth may be different from actual ones. Specific dimensions and the like are to be determined in consideration of the description below. Furthermore, different drawings naturally include portions with different dimensional relations and ratios.

1. Green Phosphor
2. Method of Producing Green Phosphor
3. Phosphor Sheet and Method of Producing Phosphor Sheet
4. Illumination Device
5. Examples

1. Green Phosphor

A green phosphor according to the present embodiment is represented by the composition formula $(Sr_{1-y}Ca_y)_{1-x}Ga_2S_4$:$Eu_x$ ($0.03 \leq x \leq 0.20$ and $0 < y \leq 1$) and has a full width at half maximum of a diffraction peak corresponding to a (422) plane in an XRD pattern of less than 0.18. With this, high conversion efficiency of the phosphor is achieved. Herein, conversion efficiency of the phosphor refers to efficiency of absorption of excited light (absorptance), efficiency of conversion of the absorbed excited light to fluorescence (internal quantum efficiency), and efficiency of conversion of excited light, as a product of these, to fluorescence (external quantum efficiency).

Additionally, although no particular limitation is imposed on the full width at half maximum of the diffraction peak corresponding to the (422) plane in the XRD pattern of less than 0.18, the full width at half maximum is preferably less than 0.16 and more preferably less than 0.15.

Furthermore, a full width at half maximum of a PL peak of the green phosphor is preferably from 46 nm to 51 nm. With this, high color purity is achieved.

A PL peak wavelength of the green phosphor is preferably from 530 nm to 570 nm and more preferably from 540 nm to 550 nm. With this, green with high color purity is achieved.

In the aforementioned composition formula of the green phosphor, it is preferable that $0.05 \leq x \leq 0.18$ and $0.25 \leq y \leq 0.50$. With this, green with high color purity and high conversion efficiency are achieved.

The green phosphor is preferably produced by preparing a sulfite powdered mixture containing Sr, Ca, Eu, and Ga by dripping a mixed solution containing a europium compound, a strontium compound, and a calcium compound into a sulfite solution to which a powdered gallium compound is added, and subsequently by firing the powdered mixture. This provides favorable crystallizability properties and high conversion efficiency.

2. Method of Producing Green Phosphor

A method of producing a green phosphor according to the present embodiment includes the steps of: dripping a mixed solution containing a europium compound, a strontium compound, and a calcium compound into a sulfite solution to which a powdered gallium compound is added; and firing, after a sulfite powdered mixture containing Sr, Ca, Eu, and Ga is prepared, the prepared powdered mixture to produce a green phosphor represented by the composition formula $(Sr_{1-y}Ca_y)_{1-x}Ga_2S_4$:$Eu_x$ ($0.03 \leq x \leq 0.20$ and $0 < y \leq 1$.) That is to say, the method of producing a green phosphor according to the present embodiment adopts a wet method, in which starting substances are generated in a liquid phase.

Examples of a europium compound may include europium nitrate [$Eu(NO_3)_3.xH_2O$], europium oxalate [$Eu_2(C_2O_4)_3.xH_2O$], europium carbonate [$Eu_2(CO_3)_3.xH_2O$], europium sulfate [$Eu_2(SO_4)_3$], europium chloride [$EuCl_3.xH_2O$], europium fluoride [$EuF_3$], europium hydride [$EuH_x$], europium sulfide [$EuS$], tri-i-propoxy europium [$Eu(O-i-C_3H_7)_3$], and europium acetate [$Eu(O—CO—CH_3)_3$].

Examples of a strontium compound may include strontium nitrate [$Sr(NO_3)_2$], strontium oxide [$SrO$], strontium bromide [$SrBr_2.xH_2O$], strontium chloride [$SrCl_2.xH_2O$], strontium carbonate [$SrCO_3$], strontium oxalate [$SrC_2O_4$—$H_2O$], strontium fluoride [$SrF_2$], strontium iodide [$SrI_2.xH_2O$], strontium sulfate [$SrSO_4$], strontium hydroxide [$Sr(OH)_2.xH_2O$], and strontium sulfide [$SrS$].

Examples of a calcium compound may include calcium nitrate [$Ca(NO_3)_2$], calcium oxide [$CaO$], calcium bromide [$CaBr_2.xH_2O$], calcium chloride [$CaCl_2.xH_2O$], calcium carbonate [$CaCO_3$], calcium oxalate [$CaC_2O_4$—$H_2O$], calcium fluoride [$CaF_2$], calcium iodide [$CaI_2.xH_2O$], calcium sulfate [$CaSO_4$], calcium hydroxide [$Ca(OH)_2$], and calcium sulfide [$CaS$].

Examples of a solvent used to prepare a mixed solution containing a europium compound, a strontium compound, and a calcium compound may include pure water, a nitric acid solution, an ammonia solution, a hydrochloric acid solution, a sodium hydroxide solution, and a mixed solution thereof.

Examples of a powdered gallium compound may include gallium oxide [$Ga_2O_3$], gallium sulfate [$Ga_2(SO_4)_3.xH_2O$], gallium nitrate [$Ga(NO_3)_3.xH_2O$], gallium bromide [$GaBr_3$], gallium chloride [$GaCl_3$], gallium iodide [$GaI_3$], gallium(II) sulfide [$GaS$], gallium(III) sulfide [$Ga_2S_3$], and gallium oxy-hydroxide [$GaOOH$].

Examples of sulfite to which a powdered gallium compound is added may include ammonium sulfite, sodium sulfite, and potassium sulfite. Besides sulfite, carbonate (for example, sodium carbonate, potassium carbonate, and magnesium carbonate) may also be used.

The present embodiment is not limited to the aforementioned production method, and by adding a powdered gallium compound to a mixed solution containing a europium compound, a strontium compound, and a calcium compound, by dripping the resulting mixed solution containing Eu, Sr, Ca, and Ga into a sulfite solution, and by firing, after a sulfite powdered mixture containing Sr, Ca, Eu, and Ga is prepared, the prepared powdered mixture, the green phosphor represented by the composition formula $(Sr_{1-y}Ca_y)_{1-x}Ga_2S_4$:$Eu_x$ ($0.03 \leq x \leq 0.20$ and $0 < y \leq 1$) may also be produced.

3. Phosphor Sheet and Method of Producing Phosphor Sheet

A phosphor sheet according to the present embodiment includes: moisture vapor barrier films; and a phosphor layer sandwiched between the moisture vapor barrier films. The phosphor layer contains a green phosphor a red phosphor, the green phosphor being represented by the composition formula $(Sr_{1-y}Ca_y)_{1-x}Ga_2S_4$:$Eu_x$ ($0.03 \leq x \leq 0.20$ and $0 < y \leq 1$) and having a full width at half maximum of a diffraction peak corresponding to a (422) plane in an XRD pattern of less than 0.18. This provides white light that may provide a wide range of color gamut by using a blue LED and a near-ultraviolet LED.

Additionally, although no particular limitation is imposed on the full width at half maximum of the diffraction peak corresponding to the (422) plane in the XRD pattern of less than 0.18, the full width at half maximum is preferably less than 0.16 and more preferably less than 0.15.

FIG. 1 is a schematic sectional view illustrating a structural example of an end portion of a phosphor sheet. The illustrated phosphor sheet includes a phosphor layer 11 that is sandwiched between the first moisture vapor barrier film 12 and the second moisture vapor barrier film 13.

The phosphor layer 11 contains a green phosphor that emits green fluorescence having a wavelength of from 530 to 570 nm, preferably from 540 to 550 nm, when irradiated with blue excitation light and also contains a red phosphor that emits red fluorescence having a wavelength of from 620 to 660 nm when irradiated with blue excitation light, and thus, converts irradiating blue light to white light.

As a green phosphor, the one that is represented by the composition formula $(Sr_{1-y}Ca_y)_{1-x}Ga_2S_4:Eu_x$ ($0.03 \leq x \leq 0.20$ and $0 < y \leq 1$) and that has a full width at half maximum of a diffraction peak corresponding to a (422) plane in an XRD pattern of less than 0.18, preferably less than 0.16, and more preferably less than 0.15, is used. In the aforementioned composition formula of a green phosphor, it is preferable that $0.05 \leq x \leq 0.18$ and $0.25 \leq y \leq 0.50$. With this, green with high color purity and high conversion efficiency are achieved.

Other examples of a green phosphor than the aforementioned green phosphor may include $Zn_2SiO_4:Mn$, $Y_3Al_5O_{12}:Ce^{3+}$, $(Y,Gd)Al_3(BO_3)_4:Tb^{3+}$, $Ca_3Sc_2Si_3O_{12}:Ce$, $CaSc_2O_4:Ce$, $Ba_3Si_6O_{12}N_2:Eu$, and β-sialon:$Eu^{2+}$, and these may be used alone or in combination of two or more.

No particular limitation is imposed on a red phosphor, and any of a sulfide-based phosphor, an oxide-based phosphor, a nitride-based phosphor, a fluoride-based phosphor, or the like may be used alone or in combination of two or more in accordance with type, absorption band, emission band, or the like of the phosphor.

Detailed examples of a red phosphor may include (ME:Eu)S, $(M:Sm)_x(Si,Al)_{12}(O,N)_{16}$, $ME_2Si_5N_8:Eu$, (ME:Eu)$SiN_2$, (ME:Eu)AlSiN$_3$, (ME:Eu)$_3SiO_5$, (Ca:Eu)SiN$_2$, (Ca:Eu)AlSiN$_3$, $Y_2O_3:Eu$, $YVO_4:Eu$, $Y(P,V)O_4:Eu$, $3.5MgO \cdot 0.5MgF_2 \cdot Ge_2:Mn$, $CaSiO_3:Pb,Mn$, $Mg_6AsO_{11}:Mn$, $(Sr,Mg)_3(PO_4)_3:Sn$, $La_2O_2S:Eu$, and $Y_2O_2S:Eu$. Among these examples of a red phosphor, CaS:Eu or $(Ba,Sr)_3SiO_5:Eu$, by which a wide range of color gamut may be provided, is preferably used. Herein, "ME" refers to at least one type of atom selected from the group consisting of Ca, Sr, and Ba, and "M" refers to at least one type of atom selected from the group consisting of Li, Mg, and Ca. Additionally, a substance preceding a colon (:) symbol indicates a parent body, and a substance following the colon symbol indicates an activator.

The surfaces of a green phosphor and a red phosphor are preferably coated. With this, deterioration in characteristics of phosphors is prevented. As compounds for coating the surfaces, for example, oxides, such as silicon oxide, yttrium oxide, aluminum oxide, and lanthanum oxide, may be used. These compounds may be used alone or in combination of two or more.

The phosphor layer 11 is obtained by forming a resin composition containing powdered green and red phosphors into a film. The resin composition from which the phosphor layer 11 is formed contains a resin component, which is preferably either a polyolefin copolymer component or a photo-curing (meth)acryl resin component.

Examples of a polyolefin copolymer include a styrene-based copolymer or a hydrogenated substance thereof. Such a styrene-based copolymer or a hydrogenated substance thereof may preferably include a styrene-ethylene-butylene-styrene block copolymer or a hydrogenated substance thereof, and a styrene-ethylene-propylene block copolymer or a hydrogenated substance thereof. Especially, a hydrogenated substance of a styrene-ethylene-butylene-styrene block copolymer is preferably used because of its transparency and gas barrier properties. By incorporating such a polyolefin copolymer component, increased light stability and reduced water absorption properties are achieved.

Examples of the photo-curing (meth)acrylate resin component may include urethane (meth)acrylate, polyester (meth)acrylate, and epoxy (meth)acrylate, and especially, urethane (meth)acrylate is preferably used because of its heat resistance after photo-curing. By incorporating such a photo-curing (meth)acrylate resin component, increased light stability and reduced water absorption properties are achieved.

In addition, other light transmissive resins, color pigments, solvents, or the like may also be blended in the resin composition as needed as long as they do not impart the advantageous effect of the present disclosure.

The moisture vapor barrier films 12 and 13 each are a gas barrier film including a film or a substrate made of plastic, such as polyethylene terephthalate (PET), and a thin film that is formed on a surface of the film or the substrate and that is made of a metallic oxide, such as aluminum oxide, magnesium oxide, and silicon oxide. Any film having a multi-layer structure, such as PET/SiOx/PET, may also be used.

In the phosphor sheet, it is preferable that the end portion of the first moisture vapor barrier film 12 and the end portion of the second moisture vapor barrier film 13 are sealed by a cover member 14 having a moisture vapor transmission rate of 1 g/m$^2$/day or less.

Examples of the cover member 14 include an adhesive tape including a base material 141 that has a moisture vapor transmission rate of 1 g/m$^2$/day or less and that is coated with an adhesive 142. As the base material 141, metallic foil, such as aluminum foil, and the moisture vapor barrier films 12 and 13 may be used. The aluminum foil may be shiny white aluminum or matte black aluminum, and when a pleasant color hue is desired in the end portion of the phosphor sheet, white aluminum is preferably used. The cover member 14 applied onto the moisture vapor barrier films has a width W that is preferably from 1 mm to 10 mm and more preferably from 1 mm to 5 mm in consideration of water vapor barrier properties and strength. The cover member 14 with the above structure prevents moisture vapor from entering the phosphor layer from the end portions of the moisture vapor barrier films, and accordingly, prevents deterioration in phosphors included in the phosphor layer.

Figure 2:
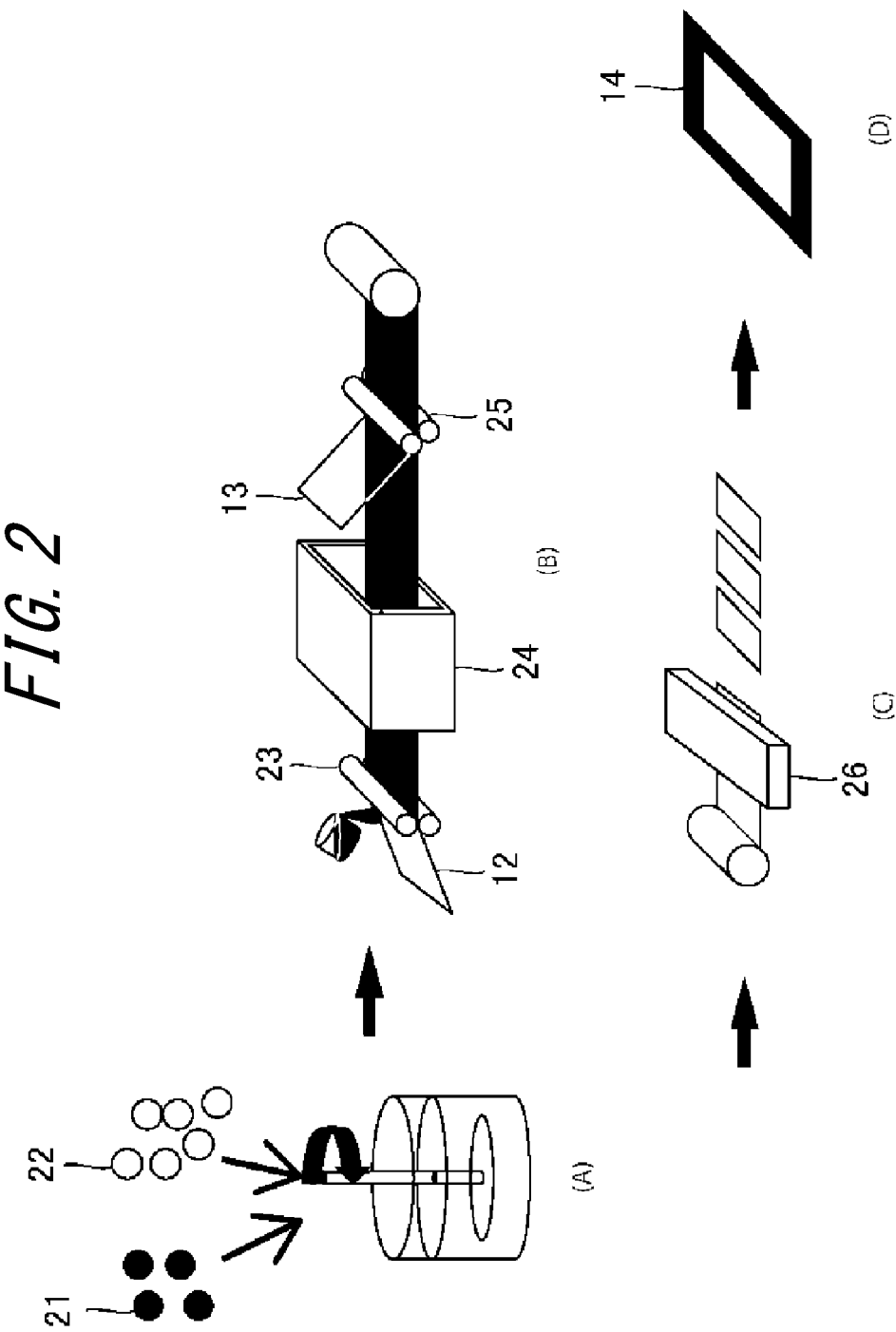
FIG. 2 is a schematic view illustrating an example of a method of producing a phosphor sheet.

FIG. 2 is a schematic view illustrating an example of a method of producing a phosphor sheet. As illustrated in FIG. 2, the concrete example of a method of producing a phosphor sheet includes a stirring step (A), a lamination step (B), a punching step (C), and a sealing step (D).

In the stirring step (A), a red phosphor 21 and a green phosphor 22 are added, in a predetermined compounding ratio, into, for example, a resin paste dissolved in a solvent, and thus, a phosphor-containing resin paste is prepared. In the lamination step (B), the phosphor resin paste is applied onto the first water vapor barrier film 12, the thickness of the phosphor resin paste is made uniform by using a bar coater 23, and the phosphor resin paste is dried in an oven 24, and thus, the phosphor layer 11 is formed. Then, the second water vapor barrier film 13 is applied onto the phosphor layer 11 by using a heat laminator 25 to obtain a raw material of the phosphor sheet including the phosphor layer 11 sandwiched between the first and second moisture vapor barrier films 12 and 13. In the punching step (C), the raw material of the phosphor sheet is punched by a pressing machine 26 to obtain the phosphor sheet of a predetermined size. At this stage, the phosphor layer is exposed on side surfaces of the end portion of the phosphor sheet. In the sealing step (D), the phosphor layer exposed between the first water vapor barrier film and the second water vapor barrier film is sealed by using, for example, an aluminum foil tape as the cover member 14.

The above steps (A) through (D) are used to produce the phosphor sheet in which the end portions of the first and second water vapor barrier films 12 and 13 are sealed by the cover member 14.

4. Illumination Device

Figure 3:
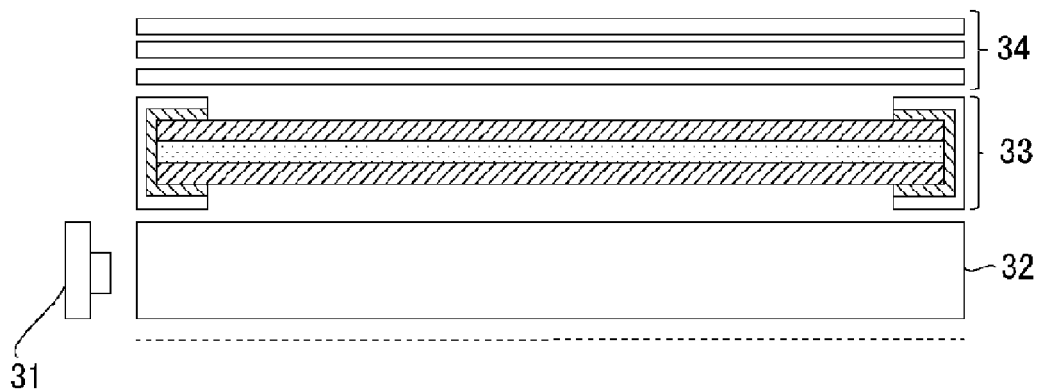
FIG. 3 is a schematic sectional view illustrating an edge-lit illumination device.

Next, a description is given of an illumination device using the phosphor sheet described above. FIG. 3 is a schematic sectional view illustrating an edge-lit illumination device. As illustrated in FIG. 3, the illumination device employs a so-called edge-lit backlight including a blue LED 31, a light guide panel 32 that diffuses blue light introduced from the blue LED 31 to the light guide panel 32 through a side surface of the light guide panel 32, a phosphor sheet 33 that produces white light from blue light, and an optical film 34.

The blue LED 31 includes a so-called LED package having, for example, an InGaN-based LED chip as a blue light emitting device. The light guide panel 32 may be formed by a transparent substrate, such as an acryl plate, that evenly diffuses the light introduced from the end surface for surface emission. The phosphor sheet 33 includes a powdered phosphor that produces white light from blue light emitted from the blue light emitting device. The phosphor powder used herein has an average particle diameter of several μm to several tens of μm. This enhances light scattering effect of the phosphor sheet 33. The optical film 34 may be a reflective polarizer film, a diffusion film, or the like used for improving visibility of a liquid crystal display device.

Figure 4:
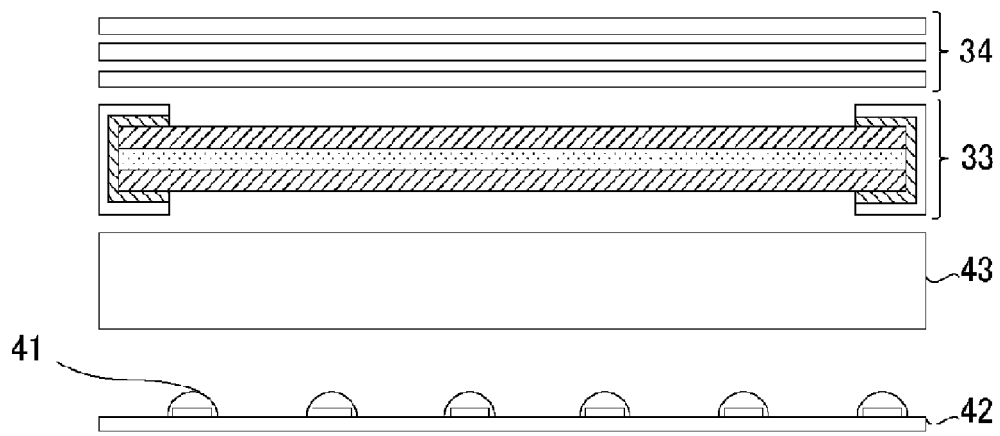
FIG. 4 is a schematic sectional view illustrating a direct-lit illumination device.

FIG. 4 is a schematic sectional view illustrating a direct-lit illumination device. As illustrated in FIG. 4, the illumination device employs a so-called direct-lit backlight including a substrate 42 on which blue LEDs 41 are two-dimensionally arranged, a diffusion panel 43 that diffuses blue light from the blue LEDs 41, the phosphor sheet 33 that is arranged to be spaced apart from the substrate 42 and that produces white light from blue light, and the optical film 34.

Each blue LED 41 includes a so-called LED package having, for example, an InGaN-based LED chip as a blue light emitting device. The substrate 42 is formed by a glass cloth base material using a resin, such as phenol, epoxy, and polyimide, and the blue LEDs 41 are two-dimensionally arranged at an equal interval with a predetermined pitch on the substrate 42 in correspondence with the entire surface of the phosphor sheet 33. As needed, a surface of the substrate 42 on which the blue LEDs 41 are arranged may be subjected to reflective processing. The substrate 42 and the phosphor sheet 33 are arranged at a distance of approximately from 10 to 50 mm, and thus, the illumination device employs a so-called remote phosphor structure. The space between the substrate 42 and the phosphor sheet 33 is maintained by a plurality of support columns and a reflective plate in a manner such that four sides of the space formed between the substrate 42 and the phosphor sheet 33 are surrounded by the support columns and the reflective plate. The diffusion panel 43 serves to diffuse light emitted from the blue LEDs 41 over a broad area so that the shape of the light source becomes invisible, and the diffusion panel 43 has a total light transmission rate of, for example, from 20% or more to 80% or less.

In the illumination device with the above structure, the phosphor layer of the phosphor sheet 33 contains a green phosphor and a red phosphor, the green phosphor being represented by the composition formula $(Sr_{1-y}Ca_y)_{1-x}Ga_2S_4$:$Eu_x$ ($0.03 \leq x \leq 0.20$ and $0 < y \leq 1$) and having a full width at half maximum of a diffraction peak corresponding to a (422) plane in an XRD pattern of less than 0.18. Accordingly, the illumination device may emit white light that may provide a wide range of color gamut.

Needless to say, the present disclosure is not limited to the above embodiments, and various changes may be made without departing from the gist of the present disclosure. For example, although in the aforementioned embodiments the illumination device is used as a backlight light source of a display device, the illumination device may be used as an illumination light source. When the illumination device is used as an illumination light source, the optical film 34 may be omitted in many cases. Furthermore, the phosphor-containing resin does not need to be formed into a flat sheet and may have a three-dimensional shape such as a cup shape.

EXAMPLES

5. Examples

Examples of the present disclosure are described hereinafter. In the present Examples, various types of green phosphors were produced, and X-ray diffraction (XRD), a photoluminescence (PL) spectrum, and light emitting efficiency were evaluated for each green phosphor. Note that the present disclosure is not intended to be limited to these Examples.

[Measurement of X-Ray Diffraction]

By using an X-ray powder analyzer (manufactured by Rigaku Corporation), a position (2θ) and a full width at half maximum of a diffraction peak in an X-ray diffraction (XRD) pattern using a CuKα ray were measured.

[Measurement of PL Spectrum]

By using the spectrofluorimeter FP-6500 (manufactured by JASCO Corporation), a PL peak wavelength, a PL peak intensity, and a PL peak full width at half maximum in a PL spectrum were measured.

[Measurement of Conversion Efficiency]

As conversion efficiency of each phosphor, efficiency of absorption of excited light (absorptance), efficiency of conversion of the absorbed excited light to fluorescence (internal quantum efficiency), and efficiency of conversion of excited light, as a product these, to fluorescence (external quantum efficiency) were measured. Quantum efficiency was measured by using the spectrofluorimeter FP-6500 (manufactured by JASCO Corporation). Phosphor powder was filled in a dedicated cell and irradiated with blue excited light having a wavelength of 450 nm to measure the fluorescence spectrum. Based on a result of the measurement, green quantum efficiency was measured by using quantum efficiency measurement software attached to the spectrofluorimeter.

Example 1

Firstly, $Ga_2O_3$ (with a purity of 6N), $Sr(NO_3)_2$ (with a purity of 3N), $Ca(NO_3)_2 \cdot 4H_2O$ (with a purity of 2N), and $Eu(NO_3)_3 \cdot nH_2O$ (with a purity of 3N, n=6.06), and ammonium sulfite monohydrate were prepared.

Subsequently, as illustrated in Table 1, weighings of ingredients were calculated to achieve 0.2 molar quantity of the phosphor represented by the composition formula $(Sr_{1-y}Ca_y)_{1-x}Ga_2S_4:Eu_x$ at a composition ratio of x=0.03 and y=0.35 (Eu concentration: 3 mol %, Ca substitution ratio: 35%). In Example 1, the europium compound $(Eu(NO_3)_3 \cdot nH_2O)$ weighs 2.683 g, the strontium compound $(Sr(NO_3)_2)$ weighs 25.311 g, and the calcium compound $(Ca(NO_3)_2 \cdot 4H_2O)$ weighs 15.208 g.

The europium compound, the strontium compound, and the calcium compound were added to 100 ml of pure water and fully stirred until any residual compound was found, and thus, a mixed solution containing Eu, Sr, and Ca was obtained.

Subsequently, into a solution obtained by dissolving, in 100 ml of pure water, 30.974 g of ammonium sulfite whose number of moles was 1.15 times the total number of moles of Eu, Sr, and Ca, 36.550 g of a powdered gallium compound (in the form of powder; $Ga_2O_3$) was added and fully stirred. Thus, a mixed sulfite solution was prepared.

Into the prepared mixed sulfite solution, the aforementioned mixed solution containing Eu, Sr, and Ca was dripped, and a precipitation/settling was obtained. The precipitation/settling is a mixture of europium/strontium/calcium sulfite powder and gallium oxide powder.

Then, the precipitation/settling was washed with pure water and filtrated until the conductivity reached 0.1 mS/cm or less and was dried at 120° C. for 6 hours. Subsequently, by passing it through a wire net having a nominal aperture of 100 µm, a powdered mixture containing Eu, Sr, Ca, and Ga was obtained. The obtained powdered mixture is a mixture containing europium/strontium/calcium sulfite powder (powder of $(Sr,Ca,Eu)SO_3$) and gallium oxide powder.

Subsequently, the obtained powdered mixture was fired in an electric furnace. Conditions of firing were as follows. Temperature was raised to 925° C. over 1.5 hours and subsequently was maintained at 925° C. for 1.5 hours, and after that, lowered to a room temperature over 2 hours. During firing, hydrogen sulfide was poured to the electric furnace at a rate of 0.3 liter/minute. Subsequently, by passing it through a mesh having a nominal aperture of 25 µm, phosphor particles of $(Sr_{1-y}Ca_y)_{1-x}Ga_2S_4:Eu_x$ (x=0.03, y=0.35) were obtained. The above method of preparing the sample is represented as the wet method 1 in Table 1.

Table 1 shows evaluation results of the phosphor of Example 1. As a result of measurement of the X-ray diffraction pattern, a diffraction peak corresponding to the (422) plane appeared at a diffraction angle 2θ=24.22°, and a half value of the diffraction peak was 0.130 deg. The diffraction peak corresponding to the (422) plane was the maximum peak in the X-ray diffraction pattern. As a result of measurement of the PL spectrum, a PL peak appeared at a wavelength of 545 nm, with a PL peak intensity of 2.97 (YAG ratio) and a full width at half maximum of 48.46 nm. As a result of calculation of the conversion efficiency, the absorptance was 70.7%, the internal quantum efficiency was 79.4%, the internal quantum efficiency/the absorptance was 1.12, and the external quantum efficiency was 56.1%.

Example 2

As illustrated in Table 1, weighings of ingredients were calculated to achieve a 0.2 molar quantity of the phosphor represented by the composition formula $(Sr_{1-y}Ca_y)_{1-x}Ga_2S_4:Eu_x$ at a composition ratio of x=0.05 and y=0.35 (Eu concentration: 5 mol %, Ca substitution ratio: 35%). Phosphor particles of $(Sr_{1-y}Ca_y)_{1-x}Ga_2S_4:Eu_x$ (x=0.05, y=0.35) were obtained in the same way as Example 1 except for the above.

Table 1 shows an evaluation result of the phosphor of Example 2. As a result of measurement of the X-ray diffraction pattern, a diffraction peak corresponding to the (422) plane appeared at a diffraction angle 2θ=24.27°, and a half value of the diffraction peak was 0.138 deg. The diffraction peak corresponding to the (422) plane was the maximum peak in the X-ray diffraction pattern. As a result of measurement of the PL spectrum, a PL peak appeared at a wavelength of 545 nm, with a PL peak intensity of 3.51 (YAG ratio) and a full width at half maximum of 47.71 nm. As a result of calculation of the conversion efficiency, the absorptance was 80.6%, the internal quantum efficiency was 78.4%, the internal quantum efficiency/the absorptance was 0.97, and the external quantum efficiency was 63.2%.

Example 3

As illustrated in Table 1, weighings of ingredients were calculated to achieve a 0.2 molar quantity of the phosphor represented by the composition formula $(Sr_{1-y}Ca_y)_{1-x}Ga_2S_4:Eu_x$ at a composition ratio of x=0.08 and y=0.35 (Eu concentration: 8 mol %, Ca substitution ratio: 35%). Phosphor particles of $(Sr_{1-y}Ca_y)_{1-x}Ga_2S_4:Eu_x$ (x=0.08, y=0.35) were obtained in the same way as Example 1 except for the above.

Table 1 shows an evaluation result of the phosphor of Example 3. As a result of measurement of the X-ray diffraction pattern, a diffraction peak corresponding to the (422) plane appeared at a diffraction angle 2θ=24.25°, and a half value of the diffraction peak was 0.136 deg. The diffraction peak corresponding to the (422) plane was the maximum peak in the X-ray diffraction pattern. As a result of measurement of the PL spectrum, a PL peak appeared at a wavelength of 545 nm, with a PL peak intensity of 3.67 (YAG ratio) and a full width at half maximum of 47.53 nm. As a result of calculation of the conversion efficiency, the absorptance was 83.1%, the internal quantum efficiency was 79.1%, the internal quantum efficiency/the absorptance was 0.95, and the external quantum efficiency was 65.8%.

Example 4

As illustrated in Table 1, weighings of ingredients were calculated to achieve a 0.2 molar quantity of the phosphor represented by the composition formula $(Sr_{1-y}Ca_y)_{1-x}Ga_2S_4:Eu_x$ at a composition ratio of x=0.10 and y=0.35 (Eu concentration: 10 mol %, Ca substitution ratio: 35%). Phosphor particles of $(Sr_{1-y}Ca_y)_{1-x}Ga_2S_4:Eu_x$ (x=0.10, y=0.35) were obtained in the same way as Example 1 except for the above.

Table 1 shows an evaluation result of the phosphor of Example 4. As a result of measurement of the X-ray diffraction pattern, a diffraction peak corresponding to the (422) plane appeared at a diffraction angle 2θ=24.23°, and a half value of the diffraction peak was 0.137 deg. The diffraction peak corresponding to the (422) plane was the maximum peak in the X-ray diffraction pattern. As a result of measurement of the PL spectrum, a PL peak appeared at a wavelength of 545 nm, with a PL peak intensity of 3.71 (YAG ratio) and a full width at half maximum of 46.97 nm. As a result of calculation of the conversion efficiency, the absorptance was 84.0%, the internal quantum efficiency was 79.5%, the internal quantum efficiency/the absorptance was 0.95, and the external quantum efficiency was 66.8%.

Example 5

As illustrated in Table 1, weighings of ingredients were calculated to achieve a 0.2 molar quantity of the phosphor represented by the composition formula $(Sr_{1-y}Ca_y)_{1-x}Ga_2S_4$:$Eu_x$ at a composition ratio of x=0.13 and y=0.35 (Eu concentration: 13 mol %, Ca substitution ratio: 35%). Phosphor particles of $(Sr_{1-y}Ca_y)_{1-x}Ga_2S_4$:$Eu_x$ (x=0.13, y=0.35) were obtained in the same way as Example 1 except for the above.

Table 1 shows an evaluation result of the phosphor of Example 5. As a result of measurement of the X-ray diffraction pattern, a diffraction peak corresponding to the (422) plane appeared at a diffraction angle 2θ=24.25°, and a half value of the diffraction peak was 0.145 deg. The diffraction peak corresponding to the (422) plane was the maximum peak in the X-ray diffraction pattern. As a result of measurement of the PL spectrum, a PL peak appeared at a wavelength of 545 nm, with a PL peak intensity of 3.63 (YAG ratio) and a full width at half maximum of 47.14 nm. As a result of calculation of the conversion efficiency, the absorptance was 84.1%, the internal quantum efficiency was 76.9%, the internal quantum efficiency/the absorptance was 0.91, and the external quantum efficiency was 64.7%.

Example 6

As illustrated in Table 1, weighings of ingredients were calculated to achieve a 0.2 molar quantity of the phosphor represented by the composition formula $(Sr_{1-y}Ca_y)_{1-x}Ga_2S_4$:$Eu_x$ at a composition ratio of x=0.15 and y=0.35 (Eu concentration: 15 mol %, Ca substitution ratio: 35%). Phosphor particles of $(Sr_{1-y}Ca_y)_{1-x}Ga_2S_4$:$Eu_x$ (x=0.15, y=0.35) were obtained in the same way as Example 1 except for the above.

Table 1 shows an evaluation result of the phosphor of Example 6. As a result of measurement of the X-ray diffraction pattern, a diffraction peak corresponding to the (422) plane appeared at a diffraction angle 2θ=24.25°, and a half value of the diffraction peak was 0.145 deg. The diffraction peak corresponding to the (422) plane was the maximum peak in the X-ray diffraction pattern. As a result of measurement of the PL spectrum, a PL peak appeared at a wavelength of 546 nm, with a PL peak intensity of 3.75 (YAG ratio) and a full width at half maximum of 47.26 nm. As a result of calculation of the conversion efficiency, the absorptance was 84.8%, the internal quantum efficiency was 78.6%, the internal quantum efficiency/the absorptance was 0.93, and the external quantum efficiency was 66.6%.

Example 7

As illustrated in Table 1, weighings of ingredients were calculated to achieve a 0.2 molar quantity of the phosphor represented by the composition formula $(Sr_{1-y}Ca_y)_{1-x}Ga_2S_4$:$Eu_x$ at a composition ratio of x=0.18 and y=0.35 (Eu concentration: 18 mol %, Ca substitution ratio: 35%). Phosphor particles of $(Sr_{1-y}Ca_y)_{1-x}Ga_2S_4$:$Eu_x$ (x=0.18, y=0.35) were obtained in the same way as Example 1 except for the above.

Table 1 shows an evaluation result of the phosphor of Example 7. As a result of measurement of the X-ray diffraction pattern, a diffraction peak corresponding to the (422) plane appeared at a diffraction angle 2θ=24.22°, and a half value of the diffraction peak was 0.139 deg. The diffraction peak corresponding to the (422) plane was the maximum peak in the X-ray diffraction pattern. As a result of measurement of the PL spectrum, a PL peak appeared at a wavelength of 545 nm, with a PL peak intensity of 3.68 (YAG ratio) and a full width at half maximum of 46.88 nm. As a result of calculation of the conversion efficiency, the absorptance was 84.8%, the internal quantum efficiency was 78.1%, the internal quantum efficiency/the absorptance was 0.92, and the external quantum efficiency was 66.2%.

Example 8

As illustrated in Table 1, weighings of ingredients were calculated to achieve a 0.2 molar quantity of the phosphor represented by the composition formula $(Sr_{1-y}Ca_y)_{1-x}Ga_2S_4$:$Eu_x$ at a composition ratio of x=0.20 and y=0.35 (Eu concentration: 20 mol %, Ca substitution ratio: 35%). Phosphor particles of $(Sr_{1-y}Ca_y)_{1-x}Ga_2S_4$:$Eu_x$ (x=0.20, y=0.35) were obtained in the same way as Example 1 except for the above.

Table 1 shows an evaluation result of the phosphor of Example 8. As a result of measurement of the X-ray diffraction pattern, a diffraction peak corresponding to the (422) plane appeared at a diffraction angle 2θ=24.22°, and a half value of the diffraction peak was 0.142 deg. The diffraction peak corresponding to the (422) plane was the maximum peak in the X-ray diffraction pattern. As a result of measurement of the PL spectrum, a PL peak appeared at a wavelength of 545 nm, with a PL peak intensity of 3.38 (YAG ratio) and a full width at half maximum of 46.69 nm. As a result of calculation of the conversion efficiency, the absorptance was 85.0%, the internal quantum efficiency was 71.1%, the internal quantum efficiency/the absorptance was 0.84, and the external quantum efficiency was 60.4%.

Example 9

As illustrated in Table 1, weighings of ingredients were calculated to achieve a 0.2 molar quantity of the phosphor represented by the composition formula $(Sr_{1-y}Ca_y)_{1-x}Ga_2S_4$:$Eu_x$ at a composition ratio of x=0.10 and y=0.25 (Eu concentration: 10 mol %, Ca substitution ratio: 25%). Phosphor particles of $(Sr_{1-y}Ca_y)_{1-x}Ga_2S_4$:$Eu_x$ (x=0.10, y=0.25) were obtained in the same way as Example 1 except for the above.

Table 1 shows an evaluation result of the phosphor of Example 9. As a result of measurement of the X-ray diffraction pattern, a diffraction peak corresponding to the (422) plane appeared at a diffraction angle 2θ=24.21°, and a half value of the diffraction peak was 0.137 deg. The diffraction peak corresponding to the (422) plane was the maximum peak in the X-ray diffraction pattern. As a result of measurement of the PL spectrum, a PL peak appeared at a wavelength of 544 nm, with a PL peak intensity of 3.57 (YAG ratio) and a full width at half maximum of 47.04 nm. As a result of calculation of the conversion efficiency, the absorptance was 82.4%, the internal quantum efficiency was 77.9%, the internal quantum efficiency/the absorptance was 0.95, and the external quantum efficiency was 64.1%.

Example 10

As illustrated in Table 1, weighings of ingredients were calculated to achieve a 0.2 molar quantity of the phosphor represented by the composition formula $(Sr_{1-y}Ca_y)_{1-x}Ga_2S_4$:$Eu_x$ at a composition ratio of x=0.10 and y=0.50 (Eu concentration: 10 mol %, Ca substitution ratio: 50%). Phosphor particles of $(Sr_{1-y}Ca_y)_{1-x}Ga_2S_4$:$Eu_x$ (x=0.10, y=0.50) were obtained in the same way as Example 1 except for the above.

Table 1 shows an evaluation result of the phosphor of Example 10. As a result of measurement of the X-ray diffraction pattern, a diffraction peak corresponding to the (422) plane appeared at a diffraction angle 2θ=24.31°, and a half value of the diffraction peak was 0.148 deg. The diffraction peak corresponding to the (422) plane was the maximum peak in the X-ray diffraction pattern. As a result of measurement of the PL spectrum, a PL peak appeared at a wavelength of 547 nm, with a PL peak intensity of 3.49 (YAG ratio) and a full width at half maximum of 48.23 nm. As a result of calculation of the conversion efficiency, the absorptance was 82.4%, the internal quantum efficiency was 77.8%, the internal quantum efficiency/the absorptance was 0.94, and the external quantum efficiency was 64.1%.

Example 11

As illustrated in Table 1, weighings of ingredients were calculated to achieve a 0.2 molar quantity of the phosphor represented by the composition formula $(Sr_{1-y}Ca_y)_{1-x}Ga_2S_4$:$Eu_x$ at a composition ratio of x=0.10 and y=0.75 (Eu concentration: 10 mol %, Ca substitution ratio: 75%). Phosphor particles of $(Sr_{1-y}Ca_y)_{1-x}Ga_2S_4$:$Eu_x$ (x=0.10, y=0.75) were obtained in the same way as Example 1 except for the above.

Table 1 shows an evaluation result of the phosphor of Example 11. As a result of measurement of the X-ray diffraction pattern, a diffraction peak corresponding to the (422) plane appeared at a diffraction angle 2θ=24.55°, and a half value of the diffraction peak was 0.157 deg. The diffraction peak corresponding to the (422) plane was the maximum peak in the X-ray diffraction pattern. As a result of measurement of the PL spectrum, a PL peak appeared at a wavelength of 558 nm, with a PL peak intensity of 2.86 (YAG ratio) and a full width at half maximum of 50.04 nm. As a result of calculation of the conversion efficiency, the absorptance was 76.5%, the internal quantum efficiency was 70.6%, the internal quantum efficiency/the absorptance was 0.92, and the external quantum efficiency was 54.0%.

Example 12

As illustrated in Table 1, weighings of ingredients were calculated to achieve a 0.2 molar quantity of the phosphor represented by the composition formula $(Sr_{1-y}Ca_y)_{1-x}Ga_2S_4$:$Eu_x$ at a composition ratio of x=0.10 and y=1.00 (Eu concentration: 10 mol %, Ca substitution ratio: 100%). Phosphor particles of $(Sr_{1-y}Ca_y)_{1-x}Ga_2S_4$:$Eu_x$ (x=0.10, y=1.00) were obtained in the same way as Example 1 except for the above.

Table 1 shows an evaluation result of the phosphor of Example 12. As a result of measurement of the X-ray diffraction pattern, a diffraction peak corresponding to the (422) plane appeared at a diffraction angle 2θ=24.66°, and a half value of the diffraction peak was 0.151 deg. The maximum peak of the diffraction peak appeared at a diffraction angle 2θ=17.64°, which corresponded to the (022) plane. As a result of measurement of the PL spectrum, a PL peak appeared at a wavelength of 562 nm, with a PL peak intensity of 2.86 (YAG ratio) and a full width at half maximum of 50.27 nm. As a result of calculation of the conversion efficiency, the absorptance was 77.8%, the internal quantum efficiency was 70.0%, the internal quantum efficiency/the absorptance was 0.90, and the external quantum efficiency was 54.1%.

Example 13

As illustrated in Table 1, weighings of ingredients were calculated to achieve a 0.2 molar quantity of the phosphor represented by the composition formula $(Sr_{1-y}Ca_y)_{1-x}Ga_2S_4$:$Eu_x$ at a composition ratio of x=0.10 and y=0.25 (Eu concentration: 10 mol %, Ca substitution ratio: 25%). In Example 13, the europium compound $(Eu(NO_3)_3 \cdot nH_2O)$ weighs 8.943 g, the strontium compound $(Sr(NO_3)_2)$ weighs 28.570 g, and the calcium compound $(Ca(NO_3)_2 \cdot 4H_2O)$ weighs 10.637 g.

The europium compound, the strontium compound, and the calcium compound were added to 100 ml of pure water and fully stirred until any residual compound was found, and 36.550 g of a powdered gallium compound (in the form of powder; $Ga_2O_3$) was added. Thus, a mixed solution containing Eu, Sr, Ca, and Ga was obtained.

Subsequently, 30.974 g of ammonium sulfite whose number of moles was 1.15 times the total number of moles of Eu, Sr, and Ca was dissolved in 100 ml of pure water. Thus, a sulfite solution was prepared.

Into the prepared sulfite solution, the aforementioned mixed solution containing Eu, Sr, Ca, and Ga was dripped, and a precipitation/settling was obtained. The precipitation/settling is a mixture of europium/strontium/calcium sulfite powder and gallium oxide powder.

The subsequent processes were the same as Example 1, and thus, phosphor particles of $(Sr_{1-y}Ca_y)_{1-x}Ga_2S_4$:$Eu_x$ (x=0.10, y=0.25) were obtained. The above method of preparing the sample is represented as the wet method 2 in Table 1.

Table 1 shows an evaluation result of the phosphor of Example 13. As a result of measurement of the X-ray diffraction pattern, a diffraction peak corresponding to the (422) plane appeared at a diffraction angle 2θ=24.13°, and a half value of the diffraction peak was 0.131 deg. The diffraction peak corresponding to the (422) plane was the maximum peak in the X-ray diffraction pattern. As a result of measurement of the PL spectrum, a PL peak appeared at a wavelength of 541 nm, with a PL peak intensity of 2.94 (YAG ratio) and a full width at half maximum of 46.61 nm. As a result of calculation of the conversion efficiency, the absorptance was 79.1%, the internal quantum efficiency was 69.2%, the internal quantum efficiency/the absorptance was 0.88, and the external quantum efficiency was 54.7%.

Example 14

As illustrated in Table 1, weighings of ingredients were calculated to achieve a 0.2 molar quantity of the phosphor represented by the composition formula $(Sr_{1-y}Ca_y)_{1-x}Ga_2S_4$:$Eu_x$ at a composition ratio of x=0.13 and y=0.25 (Eu concentration: 13 mol %, Ca substitution ratio: 25%). Phosphor particles of $(Sr_{1-y}Ca_y)_{1-x}Ga_2S_4:Eu_x$ (x=0.13, y=0.25) were obtained in the same way as Example 13 except for the above.

Table 1 shows an evaluation result of the phosphor of Example 14. As a result of measurement of the X-ray diffraction pattern, a diffraction peak corresponding to the (422) plane appeared at a diffraction angle 2θ=24.18°, and a half value of the diffraction peak was 0.153 deg. The diffraction peak corresponding to the (422) plane was the maximum peak in the X-ray diffraction pattern. As a result of measurement of the PL spectrum, a PL peak appeared at a wavelength of 542 nm, with a PL peak intensity of 3.30 (YAG ratio) and a full width at half maximum of 48.02 nm. As a result of calculation of the conversion efficiency, the absorptance was 80.8%, the internal quantum efficiency was 73.4%, the internal quantum efficiency/the absorptance was 0.91, and the external quantum efficiency was 59.3%.

Comparative Example 1

Firstly, $Ga_2O_3$ (with a purity of 6N), $CaCO_3$ (with a purity of 4N), $SrCO_3$ (with a purity of 3N), and $Eu_2O_3$ (with a purity of 3N) were prepared.

at 925° C. for 1.5 hours, and after that, lowered to a room temperature over 2 hours. During firing, hydrogen sulfide was poured to the electric furnace at a rate of 0.3 liter/minute. Subsequently, by passing it through a mesh having a nominal aperture of 25 μm, phosphor particles of $(Sr_{1-y}Ca_y)_{1-x}Ga_2S_4:Eu_x$ (x=0.10, y=0.25) were obtained. The above method of preparing the sample is represented as the dry method in Table 1.

Table 1 shows an evaluation result of the phosphor of Comparative Example 1. As a result of measurement of the X-ray diffraction pattern, a diffraction peak corresponding to the (422) plane appeared at a diffraction angle 2θ=24.22°, and a half value of the diffraction peak was 0.222 deg. The diffraction peak corresponding to the (422) plane was the maximum peak in the X-ray diffraction pattern. As a result of measurement of the PL spectrum, a PL peak appeared at a wavelength of 545 nm, with a PL peak intensity of 2.27 (YAG ratio) and a full width at half maximum of 49.30 nm. As a result of calculation of the conversion efficiency, the absorptance was 80.4%, the internal quantum efficiency was 52.0%, the internal quantum efficiency/the absorptance was 0.65, and the external quantum efficiency was 41.8%.

TABLE 1

| | Precursor production method | Eu concentration x | Ca substitution y | Position of diffraction peak of (422) plane (deg) | Full width at half maximum of diffraction peak of (422) plane (deg) | PL peak wavelength (nm) | PL peak intensity (YAG ratio) | PL peak full width at half maximum (nm) | Absorptance (%) | Internal quantum efficiency (%) | Internal quantum efficiency/absorptance | External quantum efficiency (%) |
|---|---|---|---|---|---|---|---|---|---|---|---|---|
| Example 1 | Wet method 1 | 0.03 | 0.35 | 24.22 | 0.130 | 545 | 2.97 | 48.46 | 70.7 | 79.4 | 1.12 | 56.1 |
| Example 2 | Wet method 1 | 0.05 | 0.35 | 24.27 | 0.138 | 545 | 3.51 | 47.71 | 80.6 | 78.4 | 0.97 | 63.2 |
| Example 3 | Wet method 1 | 0.08 | 0.35 | 24.25 | 0.136 | 545 | 3.67 | 47.53 | 93.1 | 79.1 | 0.95 | 65.8 |
| Example 4 | Wet method 1 | 0.10 | 0.35 | 24.23 | 0.137 | 545 | 3.71 | 46.97 | 84.0 | 79.5 | 0.95 | 66.8 |
| Example 5 | Wet method 1 | 0.13 | 0.35 | 24.25 | 0.145 | 545 | 3.63 | 47.14 | 84.1 | 76.9 | 0.91 | 64.7 |
| Example 6 | Wet method 1 | 0.15 | 0.35 | 24.25 | 0.145 | 546 | 3.75 | 47.26 | 84.8 | 78.6 | 0.93 | 66.6 |
| Example 7 | Wet method 1 | 0.18 | 0.35 | 24.22 | 0.139 | 545 | 3.68 | 46.88 | 84.8 | 78.1 | 0.92 | 66.2 |
| Example 8 | Wet method 1 | 0.20 | 0.35 | 24.22 | 0.142 | 545 | 3.38 | 46.69 | 85.0 | 71.1 | 0.84 | 60.4 |
| Example 9 | Wet method 1 | 0.10 | 0.25 | 24.21 | 0.137 | 544 | 3.57 | 47.04 | 82.4 | 77.9 | 0.95 | 64.1 |
| Example 10 | Wet method 1 | 0.10 | 0.50 | 24.31 | 0.148 | 547 | 3.49 | 48.23 | 82.4 | 77.8 | 0.94 | 64.1 |
| Example 11 | Wet method 1 | 0.10 | 0.75 | 24.55 | 0.157 | 558 | 2.86 | 50.04 | 76.5 | 70.6 | 0.92 | 54.0 |
| Example 12 | Wet method 1 | 0.10 | 1.00 | 24.66 | 0.151 | 562 | 2.86 | 50.27 | 77.8 | 70.0 | 0.90 | 54.1 |
| Example 13 | Wet method 2 | 0.10 | 0.25 | 24.13 | 0.131 | 541 | 2.94 | 46.61 | 79.1 | 69.2 | 0.88 | 54.7 |
| Example 14 | Wet method 2 | 0.13 | 0.25 | 24.16 | 0.153 | 542 | 3.30 | 46.02 | 80.8 | 73.4 | 0.91 | 59.3 |
| Comparative Example 1 | Dry method | 0.10 | 0.25 | 24.22 | 0.222 | 545 | 2.27 | 49.30 | 80.4 | 52.0 | 0.65 | 41.8 |

Subsequently, as illustrated in Table 1, weighings of ingredients were calculated to achieve 1.0 molar quantity of the phosphor represented by the composition formula $(Sr_{1-y}Ca_y)_{1-x}Ga_2S_4:Eu_x$ at a composition ratio of x=0.10 and y=0.25 (Eu concentration: 10 mol %, Ca substitution ratio: 25%). In Comparative Example 1, the europium compound ($Eu_2O_3$) weighs 3.519 g, the strontium compound ($SrCO_3$) weighs 9.965 g, the calcium compound ($CaCO_3$) weighs 2.252 g, and the gallium compound ($Ga_2O_3$) weighs 18.275 g.

The europium compound, the strontium compound, the calcium compound, and the gallium compound were mixed in ethanol by using a ball mill. After mixing, the mixture was filtrated with suction and dried at 80° C. for 6 hours. Subsequently, by passing it through a wire net having a nominal aperture of 100 μm, a powdered mixture containing Eu, Sr, Ca, and Ga was obtained.

Subsequently, 25 g of the powdered mixture was placed in an alumina firing boat and fired in the electric furnace. Conditions of firing were as follows. Temperature was raised to 925° C. over 1.5 hours and subsequently was maintained Comparative Example 1 had a wide full width at half maximum of the diffraction peak corresponding to the (422) plane in the X-ray diffraction pattern of 0.222 deg, exhibited low crystallinity, and had an external quantum efficiency of less than 50%.

On the other hand, Examples 1 to 14 had a narrow full width at half maximum of the diffraction peak corresponding to the (422) plane in the X-ray diffraction pattern of less than 0.180, exhibited high crystallinity, and had an external quantum efficiency of 50% or more.

In comparison of Comparative Example 1, Example 9, and Example 13, in which the values of x and y in the above composition formula are the same, the use of the wet methods 1 and 2, as the methods of producing precursors, improved crystallinity and provided better full widths at half maximum of XRD diffraction peaks, PL peak intensities, and conversion efficiency. Furthermore, the use of the wet method 1, rather than the wet method 2, provided the phosphors with better conversion efficiency.

Moreover, in Examples using the wet method 1, Examples 2 to 7, 9, and 10, with the composition formula where $0.05 \leq x \leq 0.18$ and $0.25 < y \leq 0.50$, exhibited superior conversion efficiency, i.e., an internal quantum efficiency/an absorptance of 0.90 or more and an external quantum efficiency of 60% or more.

REFERENCE SIGNS LIST

11 Phosphor layer
12 First moisture vapor barrier film
13 Second moisture vapor barrier film
14 Cover member
21 Red phosphor
22 Green phosphor
23 Bar coater
24 Oven
25 Heat laminator
26 Pressing machine
31 Blue LED
32 Light guide panel
33 Phosphor sheet
34 Optical film
41 Blue LED
42 Substrate
43 Diffusion panel
141 Base material
142 Adhesive

The invention claimed is:

1. A green phosphor represented by the composition formula $(Sr_{1-y}Ca_y)_{1-x}Ga_2S_4:Eu_x$, where $0.03 \leq x \leq 0.20$ and $0 < y \leq 1$, wherein
a full width at half maximum of a diffraction peak corresponding to a (422) plane in an XRD pattern using a CuKα ray is less than 0.18.

2. The green phosphor of claim 1, wherein a PL peak wavelength is from 530 nm to 570 nm.

3. The green phosphor of claim 1, wherein, in the composition formula, $0.05 \leq x \leq 0.18$ and $0.25 \leq y \leq 0.50$.

4. The green phosphor of claim 1, wherein the green phosphor is produced by dripping a mixed solution containing a europium compound, a strontium compound, and a calcium compound into a sulfite solution to which a powdered gallium compound is added and by firing, after a sulfite powdered mixture containing Sr, Ca, Eu, and Ga is prepared, the prepared powdered mixture.

5. A phosphor sheet, comprising:
moisture vapor barrier films; and
a phosphor layer sandwiched between the moisture vapor barrier films, wherein
the phosphor layer contains a green phosphor and a red phosphor, the green phosphor being represented by the composition formula $(Sr_{1-y}Ca_y)_{1-x}Ga_2S_4:Eu_x$, where $0.03 \leq x \leq 0.20$ and $0 < y \leq 1$, and having a full width at half maximum of a diffraction peak corresponding to a (422) plane in an XRD pattern using a CuKα ray of less than 0.18.

6. An illumination device, comprising the phosphor sheet of claim 5.

7. A method of producing a green phosphor, comprising the steps of:
dripping a mixed solution containing a europium compound, a strontium compound, and a calcium compound into a sulfite solution to which a powdered gallium compound is added; and
firing, after a sulfite powdered mixture containing Sr, Ca, Eu, and Ga is prepared, the prepared powdered mixture to produce a green phosphor represented by the composition formula $(Sr_{1-y}Ca_y)_{1-x}Ga_2S_4:Eu_x$, where $0.03 \leq x \leq 0.20$ and $0 < y \leq 1$.

* * * * *